United States Patent
Collins, III et al.

(10) Patent No.: US 6,756,186 B2
(45) Date of Patent: Jun. 29, 2004

(54) PRODUCING SELF-ALIGNED AND SELF-EXPOSED PHOTORESIST PATTERNS ON LIGHT EMITTING DEVICES

(75) Inventors: William D. Collins, III, San Jose, CA (US); Wayne L. Snyder, Palo Alto, CA (US); Daniel A. Steigerwald, Cupertino, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 138 days.

(21) Appl. No.: 10/104,883

(22) Filed: Mar. 22, 2002

(65) Prior Publication Data

US 2003/0181122 A1 Sep. 25, 2003

(51) Int. Cl.⁷ ............................................. H01J 9/227
(52) U.S. Cl. ...................... 430/321; 430/945; 445/24
(58) Field of Search ................................ 430/321, 315, 430/319, 945; 445/24

(56) References Cited

FOREIGN PATENT DOCUMENTS

WO      WO 97/48138     * 12/1997

* cited by examiner

Primary Examiner—John A. McPherson
(74) Attorney, Agent, or Firm—Patent Law Group LLP; Rachel V. Leiterman

(57) ABSTRACT

A method of forming a photoresist mask on a light emitting device is disclosed. A portion of the light emitting device is coated with photoresist. A portion of the photoresist is exposed by light impinging on the interface of the light emitting device and the photoresist from inside the light emitting device. The photoresist is developed, removing either the exposed photoresist or the unexposed photoresist. In one embodiment, the photoresist mask may be used to form a phosphor coating. After the photoresist is developed to remove the exposed photoresist, a phosphor layer is deposited overlying the light emitting device. The unexposed portion of photoresist is stripped. In some embodiments, the light exposing the photoresist is produced by electrically biasing the light emitting device, or by shining light into the light emitting device through an aperture or by a focussed laser.

20 Claims, 5 Drawing Sheets

PRODUCING SELF-ALIGNED AND SELF-EXPOSED PHOTORESIST PATTERNS ON LIGHT EMITTING DEVICES

BACKGROUND

1. Field of the Invention

This invention relates generally to light emitting devices, and more particularly, to producing a self-aligned, self-exposed photoresist pattern on a light emitting diode (LED).

2. Description of Related Art

Semiconductor light-emitting devices such as light emitting diodes are among the most efficient light sources currently available. Materials systems currently of interest in the manufacture of high-brightness LEDs capable of operation across the visible spectrum include Group III–V semiconductors, including binary, ternary, and quaternary alloys of gallium, aluminum, indium, and nitrogen, also referred to as III-nitride materials. Light emitting devices based on the III-nitride materials system provide for high brightness, solid-state light sources in the UV-to-yellow spectral regions. Typically, III-nitride devices are epitaxially grown on sapphire, silicon carbide, or III-nitride substrates by metal-organic chemical vapor deposition (MOCVD), molecular beam epitaxy (MBE), or other epitaxial techniques. Some of these substrates are insulating or poorly conducting. Devices fabricated from semiconductor crystals grown on such substrates must have both the positive and the negative polarity electrical contacts to the epitaxially-grown semiconductor on the same side of the device. In contrast, semiconductor devices grown on conducting substrates can be fabricated such that one electrical contact is formed on the epitaxially grown material and the other electrical contact is formed on the substrate. However, devices fabricated on conducting substrates may also be designed to have both contacts on the same side of the device on which the epitaxial material is grown in a flip-chip geometry so as to improve light extraction from LED chip, to improve the current-carrying capacity of the chip, or to improve the heat-sinking of the LED die. Two types of light emitting devices have the contacts formed on the same side of the device. In the first, called a flip chip, light is extracted through the substrate. In the second, light is extracted through transparent or semi-transparent contacts formed on the epitaxial layers.

Fabrication of an LED requires the growth of an n-type layer or layers overlying a substrate, the growth of an active region overlying the n-type layers, and the growth of a p-type layer or layers overlying the active region. Light is generated by the recombination of electrons and holes within the active region. After fabrication, the LED is typically mounted on a submount. In order to create an LED-based light source that emits white light or some color other than the color of light produced in the active region of the LED, a phosphor is disposed in the path of all or a portion of the light generated in the active region. As used herein, "phosphor" refers to any luminescent material which absorbs light of one wavelength and emits light of a different wavelength. For example, in order to produce white light, a blue LED may be coated with a phosphor that produces yellow light. Blue light from the LED mixes with yellow light from the phosphor to produce white light.

One way to produce a phosphor-converted LED is to apply a conformal coating of phosphor over the LED after mounting on the submount. A conformally-coated phosphor-converted LED is described in more detail in application Ser. No. 09/879,547, titled "Phosphor-Converted Light Emitting Device," and incorporated herein by reference. If the conformal coating of phosphor is not uniform, undesirable inconsistencies in the light generated by the phosphor-converted LED can result. Conventionally, an LED was conformally coated by using photo-masking techniques developed for planar semiconductors, where masks are used to define the size and shape of patterns to be printed in photoresist deposited on the LED and submount. The printed photoresist layer defines which areas are covered with phosphor.

The application of conventional masking techniques to three-dimensional structures such as an LED mounted on a submount is fraught with problems including stray reflected light and depth of field artifacts in the resulting image; and imperfect alignment, both of which can result in nonuniform coating of the LED. For example, light reflected from the surfaces of the three dimensional LED structure, including the surface of the photoresist layer used for masking, may introduce exposure artifacts. Also, depth-of-field problems may lead to distortions and loss of dimensional accuracy in the image produced by the mask. Additionally, not all LEDs will have a perfect shape or be perfectly aligned with other LEDs in an array of LEDs. Shape and alignment imperfections can result in nonuniform coating. Masks cannot fully compensate for the process and object variations normally seen in a manufacturing environment, leading to imperfections and yield losses.

SUMMARY

In accordance with an embodiment of the invention, a method of forming a photoresist mask on a light emitting device is disclosed. A portion of the light emitting device is coated with photoresist. A portion of the photoresist is exposed by light impinging on the interface of the light emitting device and the photoresist from inside the light emitting device. The photoresist is developed, removing either the exposed photoresist or the unexposed photoresist. In one embodiment, the photoresist mask may be used to form a phosphor coating on the light emitting device. The light emitting device is attached to a submount, and the light emitting device and submount are coated with photoresist. A portion of the photoresist is exposed by light impinging on the interface of the light emitting device and the photoresist from inside the light emitting device. The photoresist is developed to remove the exposed photoresist. A phosphor layer is deposited overlying the light emitting device, then the unexposed portion of photoresist is stripped. In some embodiments, the light exposing the photoresist is produced by electrically biasing the light emitting device, by shining light into the light emitting device through an aperture, or by shining light into the light emitting device by a steered, focussed laser.

DETAILED DESCRIPTION

In accordance with embodiments of the invention, light from an LED is used to expose photoresist, resulting in a photoresist pattern that is self-aligned with the LED. The process may eliminate depth-of-field, scattering, and mask alignment problems associated with the use of conventional masks, as well as problems resulting from non-uniformly sized LEDs.

Figure 1A:
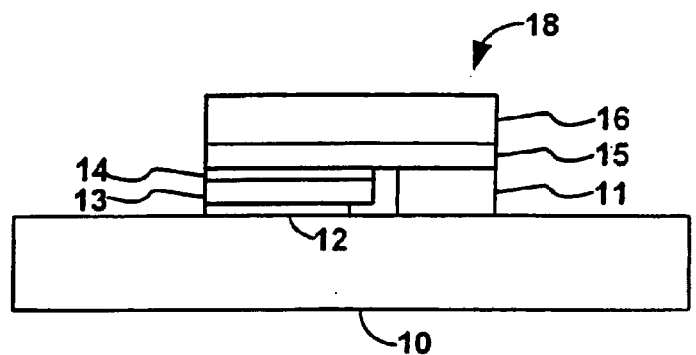
FIGS. 1A–1F illustrate an LED connected to a submount at various stages during phosphor coating.

FIGS. 1A–1F illustrate an embodiment of conformally coating an LED with phosphor using a self-aligned photoresist mask. FIG. 1A illustrates an LED 18 mounted on submount 10. LED 18 includes a substrate 16, an n-type region 15, an active region 14, and a p-type region 13. A p-contact 12 is attached to p-type region 13. An n-contact 11 is attached to n-type region 15. LED 18 may be attached to submount 10 by, for example, solder (not shown) between contacts 11 and 12 and submount 10. Other methods of attaching LED 18 to submount 10 are described in more detail in application Ser. No. 09/469,657, titled "III-Nitride Light-Emitting Device With Increased Light Generating Capability," and incorporated herein by reference. Usually, substrate 16 is transparent, and submount 10 is opaque.

Figure 1B:
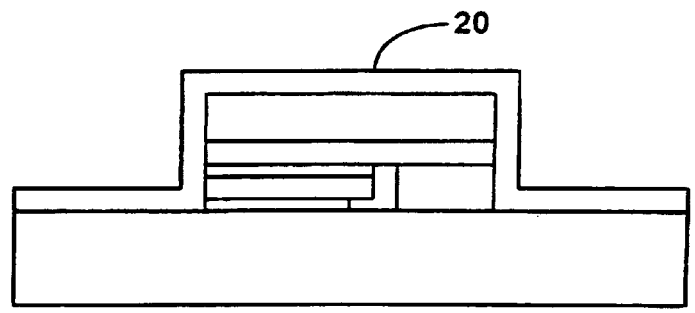

In FIG. 1B, LED 18 and submount 10 are coated with a layer of photoresist 20. Photoresist layer 20 may be, for example, a positive photoresist, meaning that when photoresist 20 is exposed to electromagnetic radiation, the radiation breaks the chemical bonds in photoresist layer 20, making it soluble in a developer solution. The portions of photoresist 20 that are not irradiated are not soluble in a developer solution, and are therefore left behind when photoresist layer 20 is developed. Photoresist 20 may be, for example, a dry film photoresist applied by a heated vacuum coater, a liquid film photoresist, an electrophoretically deposited photoresist, a screen printed photoresist, or any other suitable photoresist. Generally, photoresist 20 is a positive acting photoresist.

Figure 1C:
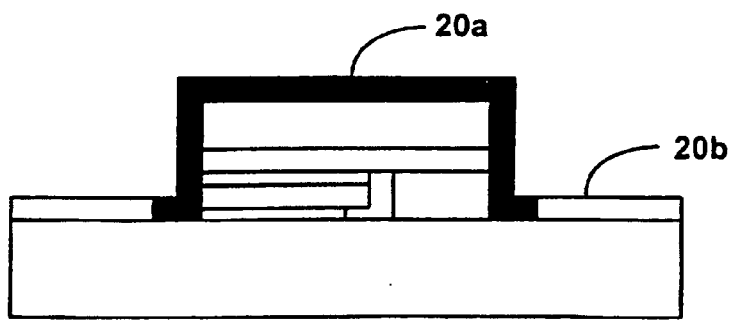
Figure 2:
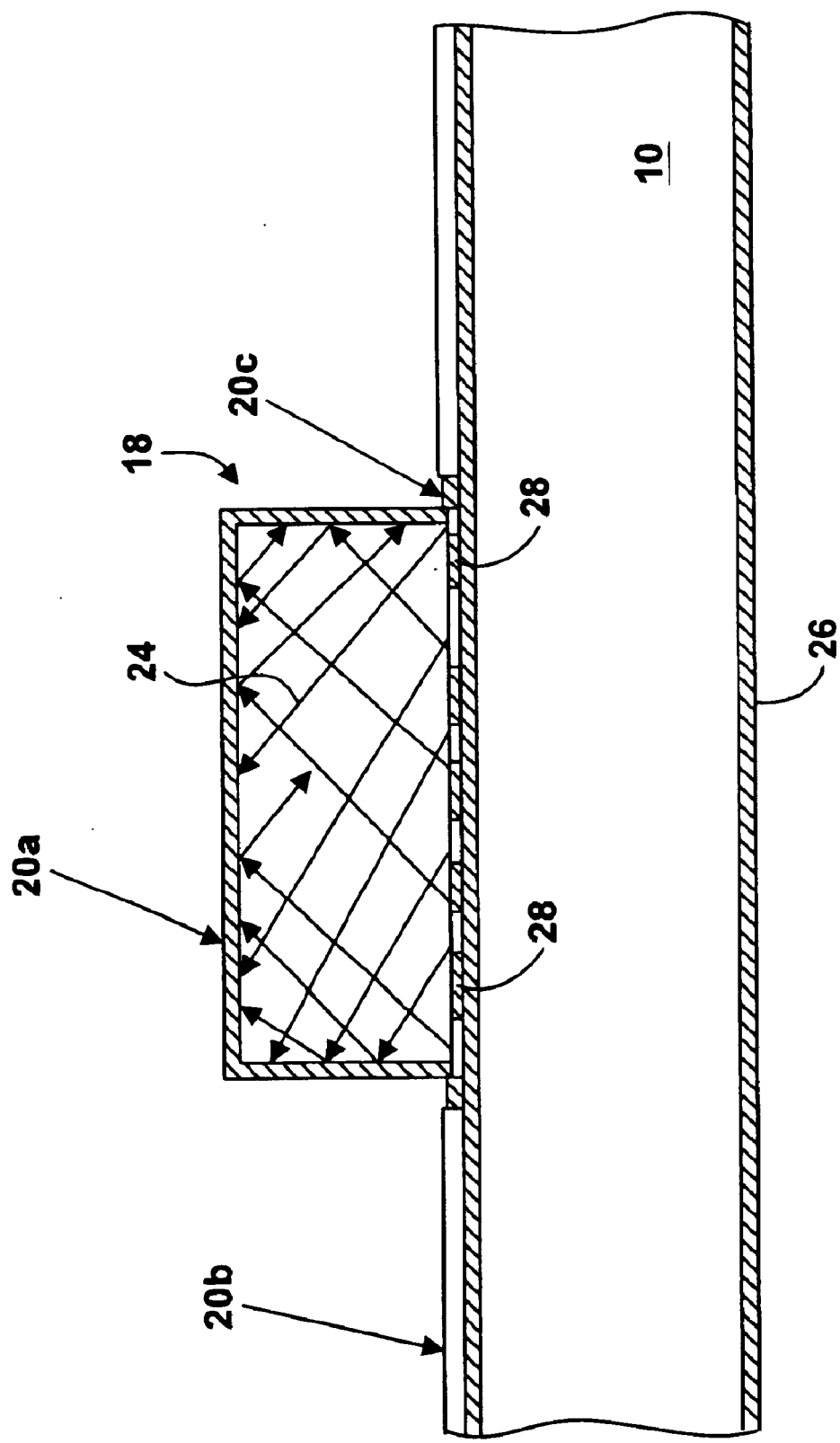
FIG. 2 illustrates an embodiment of self-exposing photoresist.
Figure 3:
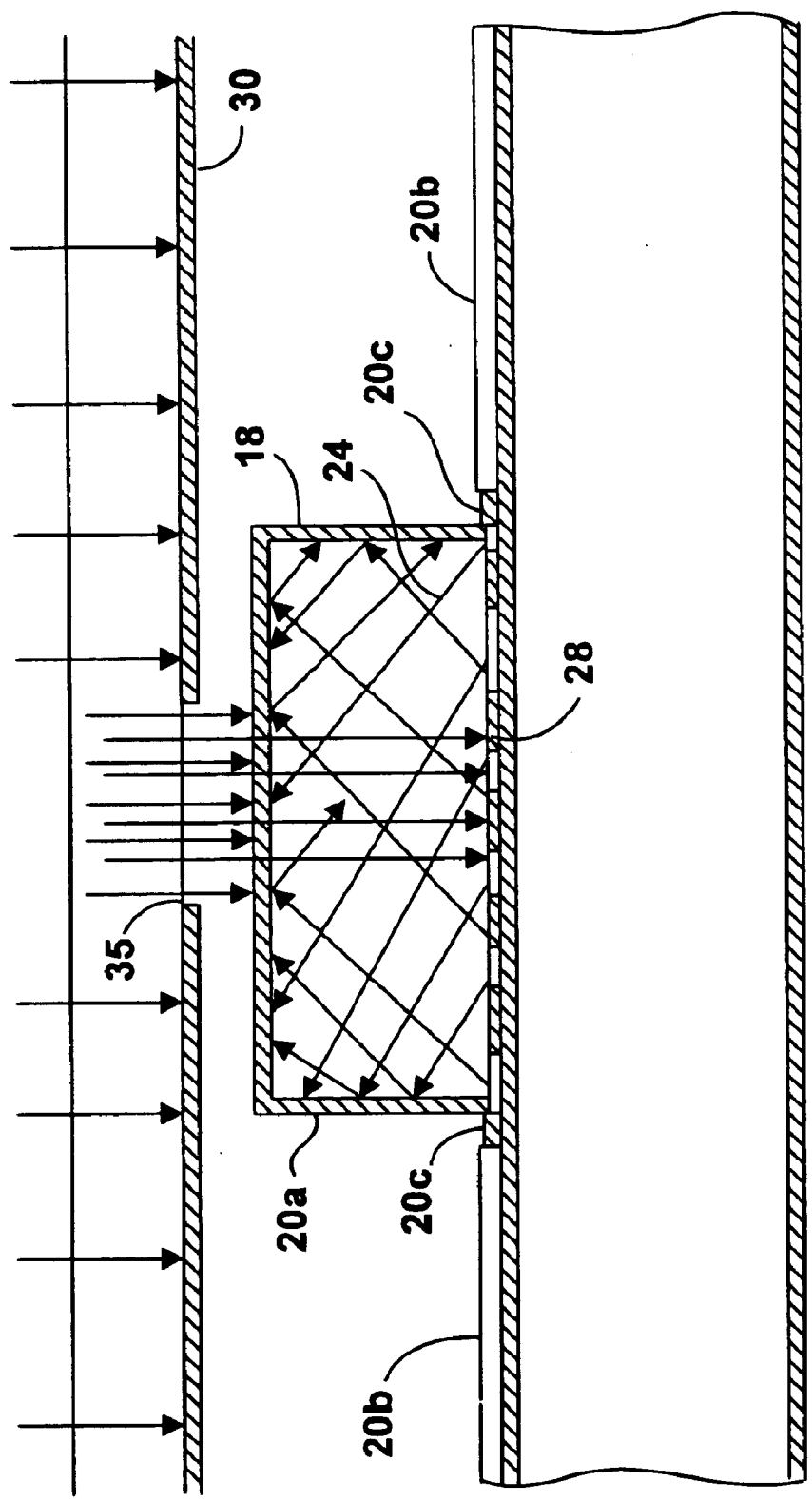
FIG. 3 illustrates an alternative embodiment of self-exposing photoresist.

In FIG. 1C, photoresist layer 20a is exposed to light from LED 18. Photoresist layer 20b is not exposed to light from LED 18. FIGS. 2 and 3 illustrate two embodiments of exposing photoresist layer 20a. In an embodiment illustrated in FIG. 2, LED 18 is electrically biased in order to generate light 24. Light 24 may be internally reflected off the photoresist covered surfaces of LED 18, exposing the photoresist covering those surfaces. Usually, contacts 11 and 12 (shown in FIG. 1A) are highly reflective, which aids the scattering of light 24 within LED 18. The internally reflected light 24 produces a self-aligned exposed layer of photoresist, including an annulus of controlled thickness 20c surrounding LED 18.

LED 18 of FIG. 2 may be electrically biased in two ways. First, a voltage may be applied to contacts (not shown) on the underside 26 of submount 10. The contacts on underside 26 of submount 10 are electrically connected to solder bumps 28, which are connected to contacts 11 and 12 (shown in FIG. 1A) of LED 18. The voltage causes LED 18 to emit light 24 from the active region of LED 18. In one embodiment, submount 10 is part of an undiced wafer of submounts with an LED attached to each submount on the wafer. A series of probes are connected to each row of submounts on the wafer. Each probe then provides a series of short voltage bias pulses, until a minimum required level of light exposure flux necessary to expose photoresist 20 has been produced in LED 18. Second, LED 18 may be electrically biased by RF excitation. LED 18 may produce light by rectified coupling to RF fields, when submount 10 and LED 18 are placed in proximity to an RF radiator or antenna.

In an embodiment illustrated in FIG. 3, LED 18 is optically pumped in order to generate light 24. As shown in FIG. 3, a mask 30, such as, for example, a dark field dot mask, is aligned over LED 18. Mask 30 includes an aperture 35. Aperture 35 is much smaller than LED 18, in order to simplify alignment of aperture 35 over LED 18. Aperture 35 need not be located in the center of LED 18. Aperture 35 may be of any shape. A collimated beam of light 24 is applied to mask 30. The light source used may be, for example, a flood light producing collimated light with a divergence less than 30°, a fiber optic cable connected to a remote light source, or a laser light source. A focussed laser light source may be used, and the laser may be steered to expose the photoresist coating multiple LEDs mounted on an undiced wafer of submounts. The light source first exposes the portion of photoresist under aperture 35. Light 24 transmitted through aperture 35 and the photoresist layer enters LED 18, where light 24 is reflected off the photoresist covered surfaces of LED 18, exposing the photoresist covering those surfaces. In one embodiment, the photoresist is developed to remove the photoresist layer exposed by aperture 35. Light is then shown through aperture 35 and the gap in the photoresist layer, and reflected off the walls of LED 18 to expose the remaining photoresist coating LED 18. Thus, if LED is optically pumped, two cycles of photoresist exposure and developing may be required. Alternatively, LED may be a III-nitride device with an InGaN active region, and the collimated light beam may be UV light, which excites shallow UV emissions from the active region or any other layer of LED 18. In one embodiment, the diameter of aperture 35 may be about 100 $\mu$m. LED 18 may have a top area of $(1000\,\mu m)^2$. Photoresist 20 (FIG. 1B) may have a high absorption to prevent light 24 from being transmitted through photoresist 20a and 20b.

In the embodiments illustrated in both FIGS. 2 and 3, the amount of light exposure (i.e. the exposure time and exposure intensity) necessary to develop photoresist 20 depends on the photoresist used. If a highly absorbing photoresist is used, the exposure time may be increased. The wavelength of light required to expose the photoresist also depends on the photoresist used.

After exposure to light from LED 18, exposed photoresist 20a is removed by application of a photoresist developer solution, such as a standard liquid developer. Exposed photoresist 20a is soluble in the developer solution, while unexposed photoresist 20b is not soluble in the developer solution. The developer used depends on the composition of photoresist 20. After developing, the structure shown in FIG. 1D remains.

Figure 1D:
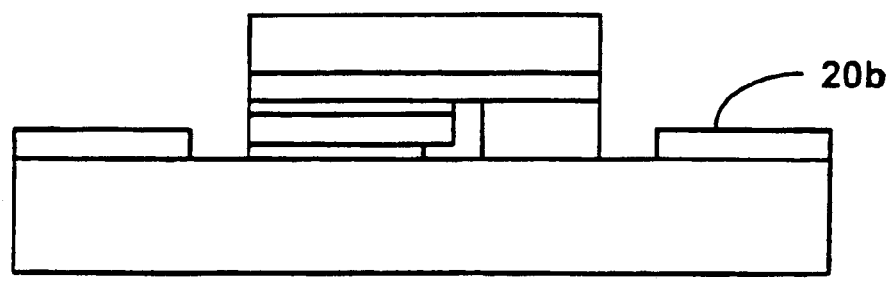
Figure 1E:
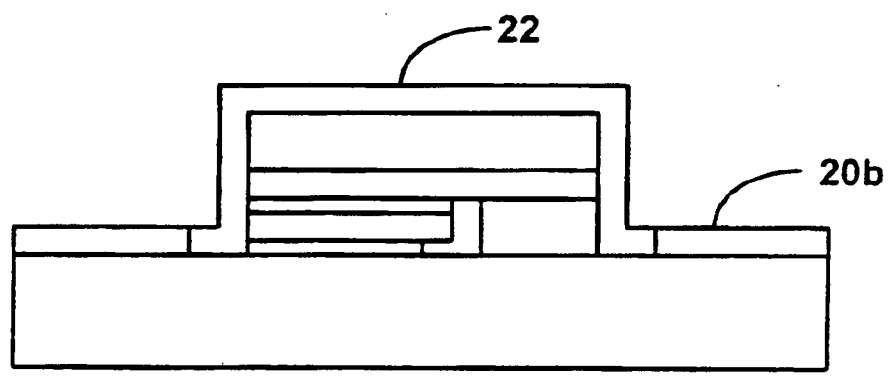
Figure 1F:
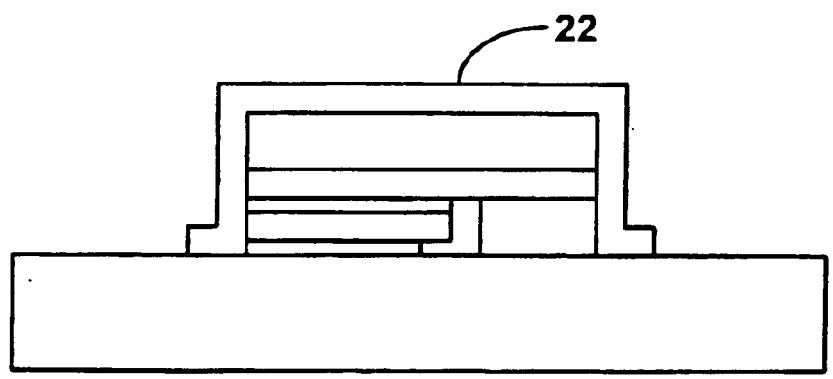

A layer of phosphor 22 is then deposited over portions of the structure shown in FIG. 1D, as shown in FIG. 1E. Phosphor 22 may be selectively deposited by, for example, screen printing or electrophoretic deposition, both of which are described in more detail in "Phosphor-Converted Light Emitting Device," previously incorporated by reference. After phosphor deposition and fixation, unexposed photoresist 20b is stripped away. The structure shown in FIG. 1F results. In one embodiment, photoresist 20 is selected such that unexposed photoresist 20b has a conductivity that is low enough to be an effective mask for electrophoretic deposition without a "hard-bake" which would further fix photoresist 20b, making photoresist 20b difficult to strip once phosphor 22 is deposited. In one embodiment, photoresist 20 is selected such that the hard-bake temperature is less than the maximum temperature allowed by LED 18 and submount 10 during phosphor coating and any curing steps required to set the phosphor coating.

Once each LED 18 on the wafer of submounts is coated with phosphor, the submounts may be tested by probing. The wafer is then diced into individual submounts, each attached to an LED. The submounts are sorted, die-attached to a package, and encapsulated with an encapsulant. Probing, dicing, sorting, die attaching, and encapsulating steps are well known in the art of packaging light emitting diodes.

In accordance with embodiments of the invention, the use of a self-exposed and self-aligned method of exposing photoresist may offer several advantages. First, since the photoresist is self-exposed by light from within LED 18, no mask, other than possibly dot mask 30 shown in FIG. 3, is required. Dot mask 30 may be a simple inexpensive alignment jig, which will work for any size or shape of LED mounted on the submount centers of the submount wafer. Thus, costly high precision alignment of a mask with the submount wafer is avoided. The elimination of patterning by a precision mask reduces variation in the phosphor thickness caused by variations in the size, shape, placement, and mounting height of LEDs 18 relative to the mask pattern. Second, depth of field and light scattering errors in the photoresist pattern are eliminated. Third, the width of annulus 20c can be controlled by light exposure, reducing variations in the light output of the final packaged conformally coated LED caused by variations in the annular thickness. In one embodiment, annulus 20c has a width that is no greater than the thickness of the photoresist coating 20. In one embodiment, the width of annulus 20c is less than 100 microns wide.

Figure 4A:
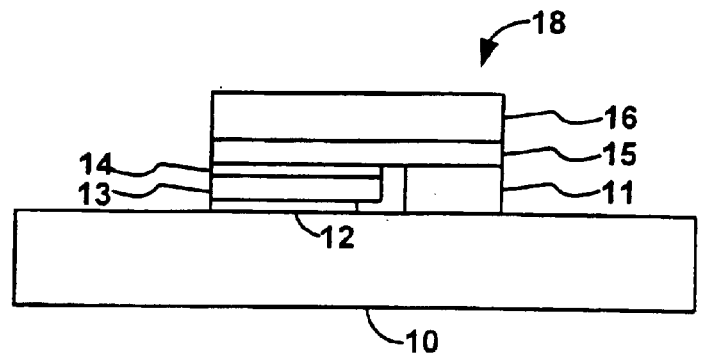
FIGS. 4A–4C illustrate an alternative embodiment of phosphor coating an LED.
Figure 4B:
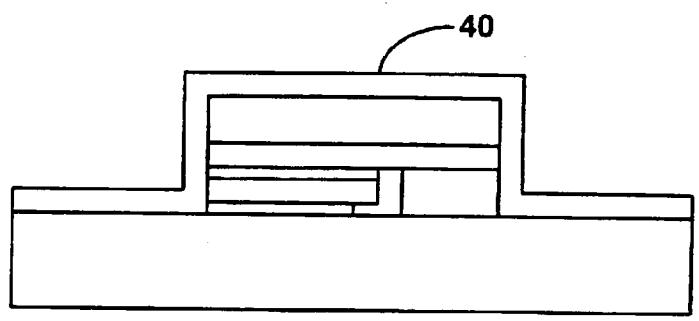
Figure 4C:
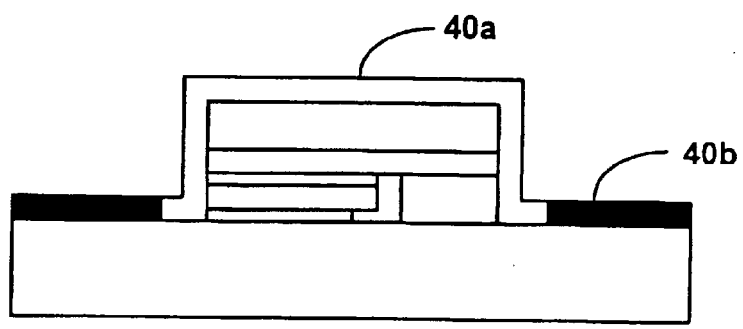

FIGS. 4A–4C illustrate an alternative method for creating a self aligned photoresist layer on an LED. In FIG. 4A, LED 18 is mounted on submount 10, resulting in the same structure as shown in FIG. 1A. The structure is then coated with a layer of photoresist 40, as shown in FIG. 4B. Photoresist 40 may be a negative photoresist filled with phosphor, fluorescent dyes, or other photoluminescent materials. In FIG. 4C, light is introduced into LED 18 by one of the method described in the text accompanying FIGS. 2 and 3. The light exposes portion 40a of photoresist layer 40. Portions 40b are unexposed. Since photoresist 40 is a negative photoresist, when photoresist 40a and 40b is developed, portions 40b of the photoresist are removed, leaving portion 40a. The structure shown in FIG. 1F results.

The above-described embodiments of the present invention are merely meant to be illustrative and not limiting. For example, the invention is not limited to III-nitride devices, and may be applied to devices made from III-phosphide or other materials systems. It will thus be obvious to those skilled in the art that various changes and modifications may be made without departing from this invention in its broader aspects. Therefore, the appended claims encompass all such changes and modifications as falling within the true spirit and scope of this invention.

What is being claimed is:

1. A method comprising:
    coating at least a portion of a light emitting device with photoresist;
    exposing a portion of the phatoresist, wherein the portion of the photoresist is exposed with light impinging on the interface of the light emitting device and the photoresist from inside the light emitting device;
    developing the photoresist, wherein developing removes the exposed portion of the photoresist; and
    depositing a photoluminescent material in a gap in the photoresist left by developing.

2. The method of claim 1, further comprising producing light inside the light emitting device by electrically biasing the light emitting device.

3. The method of claim 2 wherein the biasing is accomplished by a plurality of bias pulses.

4. The method of claim 1 further comprising producing light inside the light emitting device by placing the light emitting device near an RF source, wherein the RF source causes the light emitting device to emit light from an active region of the light emitting device.

5. The method of claim 1 farther comprising producing light inside the light emitting device by:
    placing an aperture over a portion of the light emitting device;
    shining light through the aperture.

6. The method of claim 5 wherein the aperture is smaller than a dimension of the light emitting device.

7. The method of claim 5 wherein shining light through the aperture comprises shining a substantially collimated light beam through the aperture.

8. The method of claim 1 further comprising producing light inside the light emitting device by exposure by a focussed laser beam.

9. The method of claim 8 wherein the focussed laser beam is steered to expose a portion of the photoresist coating the light emitting device and a portion of photoresist coating a second light emitting device.

10. The method of claim 1 further comprising producing light inside the light emitting device by exposing the light emitting device to a light source which excites light emission from a layer of the light emitting device.

11. The method of claim 10 wherein the light source comprises a UV light source.

12. A method of coating a light emitting device with phosphor, the method comprising:
    attaching the light emitting device to a submount;
    coating at leant a portion of the light emitting device and at least a portion of the submount with photoresist;
    producing light impinging on an interface between the light emitting device and the photoresist from inside the light emitting device, wherein the light exposes a portion of the photoresist;
    developing the photoresist, wherein the developing removes the exposed portion of photoresist;
    depositing a phosphor layer overlying the light emitting device; and
    stripping an unexposed portion of the photoresist.

13. The method of claim 12 wherein the light emitting device is a III-nitride device.

14. The method of claim 12 wherein producing light comprises electrically biasing the light emitting device.

15. The method of claim 12 wherein producing light comprises producing enough light exposure to expose a portion of the photoresist overlying the light emitting device and an annulus of photoresist on the submount.

16. The method of claim 12 wherein producing light comprises:
    placing an aperture over a portion of the light emitting device;
    shining light through the aperture.

17. The method of claim 16 wherein the aperture has a dimension smaller than 100 microns.

18. The method of claim 12 wherein producing light comprises exposing the light emitting device to a light source which excites light emission from an active region of the light emitting device.

19. The method of claim 12 wherein depositing a phosphor layer comprises depositing a phosphor layer by electrophoretic deposition.

20. The method of claim 12 wherein the phosphor layer is deposited in a region where the photoresist has been removed by exposure and development.

* * * * *